United States Patent [19]
Bryant et al.

[11] Patent Number: 5,139,024
[45] Date of Patent: Aug. 18, 1992

[54] RESONATORS FOR MAGNETIC RESONANCE IMAGING

[75] Inventors: Robert G. Bryant, Pittsford; Joseph P. Hornak, Scottsville; Eric A. Marshall, Rochester, all of N.Y.

[73] Assignee: The University of Rochester, Rochester, N.Y.

[21] Appl. No.: 659,643

[22] Filed: Feb. 25, 1991

Related U.S. Application Data

[60] Division of Ser. No. 471,663, Jan. 24, 1990, Pat. No. 5,024,229, which is a continuation of Ser. No. 121,565, Nov. 16, 1987, abandoned.

[51] Int. Cl.$^5$ .............................................. A61B 5/055
[52] U.S. Cl. .................................. 128/653.5; 324/318
[58] Field of Search ...................... 128/653 SC, 653.5; 324/318, 322

[56] References Cited

U.S. PATENT DOCUMENTS

| | | | |
|---|---|---|---|
| 4,641,097 | 2/1987 | Bottomley et al. | 324/318 |
| 4,740,751 | 4/1988 | Misic et al. | 324/318 |
| 4,841,249 | 6/1989 | Duerr et al. | 324/318 |

*Primary Examiner*—Ruth S. Smith
*Attorney, Agent, or Firm*—Martin LuKacher

[57] ABSTRACT

Single-turn loop-gap solenoidal resonators for establishing RF fields ($B_1$) transverse to the static $B_0$ field of a magnetic resonance imaging system. Tubular forms of dielectric (plastic) material have conductive foil bands attached to their outside walls with one or more gaps between the ends of the bands and provide solenoidal single-turn coils. A circuit resonant at radio frequencies is defined by the inductance of the solenoidal coils formed by the bands and the capacitance across the gap. The resistors and/or capacitors spaced along the axis of the tubular bodies tune the circuit and provide RF magnetic field homogeneity within the structure. Holes in the sides of the forms through the bands provide for the entrance of the analytical sample or body mass of a subject (the head, shoulder, hand, foot, knee or elbow). The forms and bands are two part assemblies, each having part of the opening therein so as to facilitate the entry of the body mass to be studied into the tubular body of the resonator. A pair of canted cylindrical forms assembled together with a plate and having bands of conductive material extending around the forms and across the opposite sides of the plate define a resonator suitable for imaging of the breasts of the subject.

11 Claims, 4 Drawing Sheets

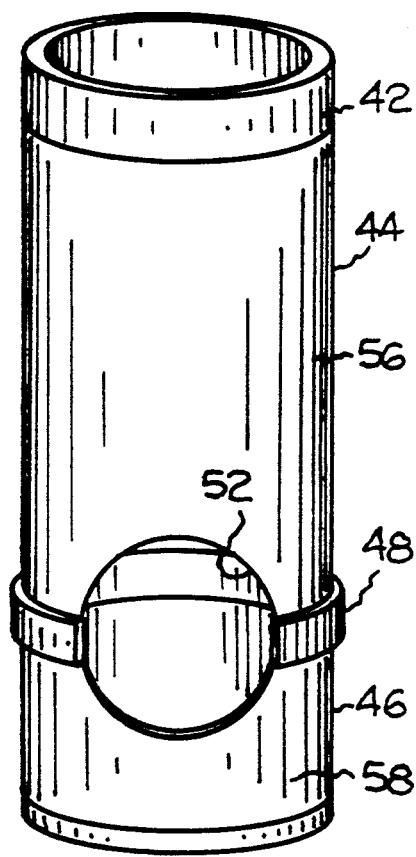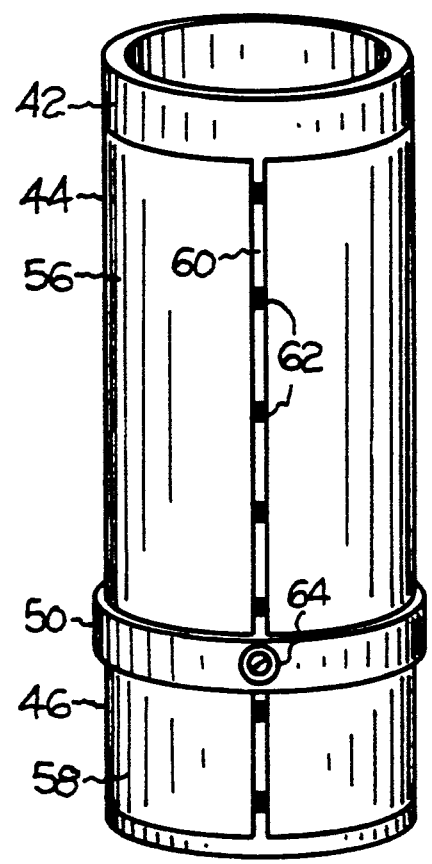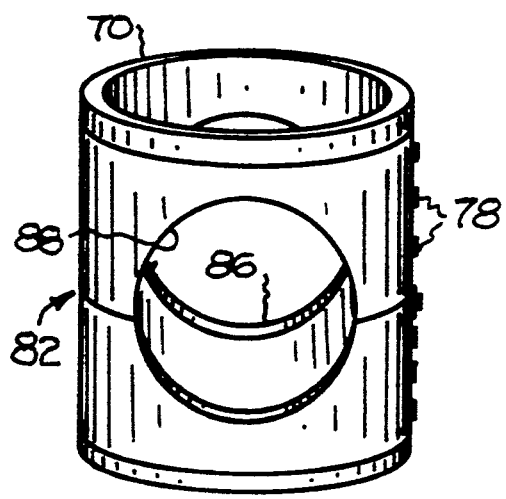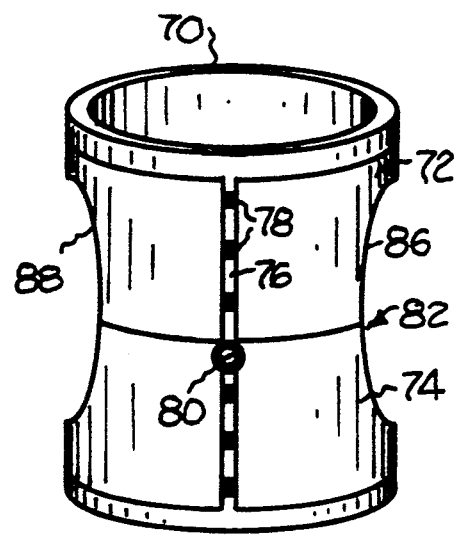

RESONATORS FOR MAGNETIC RESONANCE IMAGING

This is a division of application Ser. No. 471,663, filed Jan. 24, 1990, now U.S. Pat. No. 5,024,229, which is a continuation of application Ser. No. 121,565, filed Nov. 16, 1987, now abandoned.

DESCRIPTION

The present invention relates to resonators for use in magnetic resonance imaging and particularly to loop-gap resonators which provide homogeneous RF magnetic fields in a body mass, such as the head, feet, shoulder, hands, wrists, knees, elbows or breasts of a subject which is to be imaged.

While the invention is especially suitable for use in magnetic resonance imaging of human subjects, it may also be used for animals and for other objects, the image or chemical composition of which is to be determined by magnetic resonance spectroscopy.

In order to obtain accurate magnetic images, it is requisite that magnetic resonance signals detected from nuclear or electron magnetic moments within the resonator that establishes the rf or $B_1$ magnetic field be uniformly proportional to the spin concentration. This requirement is satisfied if the $B_1$ RF magnetic fields created by the resonator within the static $B_0$ magnetic field are homogeneous or spatially uniform over the volume of analytical interest. A contradictory requirement is the capability of conveniently placing the body mass to be imaged in the resonator such that the $B_1$ RF field in the body mass is perpendicular to the $B_0$ field.

It is also desirable that the RF energy needed for imaging be low to minimize RF exposure of the subject. Thus, the problem of providing a uniform field and ready access of the body parts into the field also involves the confinement of the field to the area of interest so as to minimize the energy to which the body is exposed, both in terms of intensity and exposure time. A further advantage of the localized excitation provided by such a device is that problems of aliasing, i.e., image or spectroscopic wrap-around, from regions of the sample outside the region of interest are minimized.

Single-turn solenoids having a cylindrical conductor with a slit along its length have been proposed for use as resonators in magnetic resonance spectroscopy. Such a coil is shown in FIG. 1, (prior art) and is discussed in J. P. Hornak, et al., *Journal of Magnetic Resonance*, 68, 319-322 (1986). As shown in FIG. 1, the resonator is constructed around a dielectric (e.g., polyethylene) form 10. The mass under test is placed within the cylindrical form 10. A conductive foil of metal, such as copper 12, is wrapped around the form and forms a cylinder with a gap 14 running along its length (parallel to the axis of the cylinder). Capacitors 16 which may be of fixed value or variable 18 are placed along the gap 14. The distribution of the capacitors and their values provide a means for tuning the uniformity or homogeniety of the rf magnetic field created within the device. RF energy may be coupled into and out of the resonator by placing a loop of wire coaxially with the cylinder above the cylinder or by connecting a transmission line across the gap (to one end thereof). The frequency of the resonator may be varied by changing the capacitance across the gap or the dimensions of the conductive elements. The equations governing the resonant frequency are given in the article by Hornak, et al., referenced above.

Other loop-gap resonators are discussed in the following United States Pat. Nos. Froncisz, 4,446,429, May 1, 1984; Hyde, et al., 4,480,239, Oct. 30, 1984; Froncisz, et al., 4,504,788, Mar. 12, 1985. They are also mentioned and shown in articles by J. B. Kneeland, et al., *Radiology*, 1986; 160: 695-699; and *Radiology* 1986; 158: 247-250; and W. N. Hardy, et al., *Rev. Sci. Instrum.*, 52(2), February 1981, p. 213-216. None of these resonators solve the problem of providing easy access to the body mass to be imaged and placement within the magnetic resonance imaging system, such as, for example, the Signa magnetic resonance imaging system which is manufactured by the General Electric Company, Milwaukee, Wis., U.S.A. The conventional mode of imaging using small RF coils is to use a so-called surface coil placed in the vicinity of the body part to be studied and used only to receive signals from the body. Excitation or transmission is typically done with a large body coil, which subjects the patient to high intensities of, or long exposure times to, RF energy. Surface coils of such type are the subject of a U.S. Pat. No. to Krause, 4,590,947, issued May 27, 1986, and other coils of this type are shown in the following U.S. Pat. Nos.: Young, 4,534,358, issued Aug. 13, 1985, and Sepponen, 4,543,959, issued Oct. 1, 1985, and also European patent application 0,142,760, published May 29, 1985.

It is, therefore, the object of the present invention to provide improved resonators for magnetic resonance imaging having one or more of the following features: easy access to the body mass to be imaged; RF magnetic field homogeneity, and tunability to control field distribution; allowing motion of the portion of the anatomy being imaged, such as knee bending, head turning, and the like; concentration of the RF field so as to reduce the RF load, minimize exposure and providing for more rapid imaging than with surface coils; and ease of fabrication and sturdiness for low cost and reliability.

Briefly described, a resonator in accordance with the invention, provides for the establishment of an RF field for nuclear magnetic resonance spectroscopy and imaging, of a portion of a body mass or analytical sample which is contained within the resonator when the resonator is disposed within a magnetic resonance imaging system which produces a $B_0$ field. The resonator includes a conductive structure or assembly defining a tube of sufficient internal volume to contain the body mass of interest. The tube, which may take a variety of cross-sectional shapes, has an axis adapted to be disposed transversely to the direction of the $B_0$ field and to provide the $B_1$ field in a direction transverse to the $B_0$ field of the magnetic resonance imaging system. The resonant device structure has one or more gap(s) disposed transversely of the axis which present(s) a capacitance which resonates with the inductance presented by the structure. The structure is preferably a single-turn of conductive material applied to an axially symmetric support. An opening into the structure transverse to the major axis defines an entrance for the sample, such as the body mass to be studied, so that the body mass can be placed easily within the confines of the resonator. Electromagnetic coupling to the resonator is achieved either capacitively or inductively and permits both transmitting and/or receiving the RF energy required for obtaining a magnetic image or a magnetic resonance spectrum.

A solenoidal resonator embodying the invention is especially adapted for use in magnetic resonance imaging of the breasts of a subject. This resonator makes use of a pair of tubular cylinders of dielectric material having base and top ends. The breast are received into the cylinders through the base ends. A plate of dielectric material having conductive material on its opposite sides is attached to and forms a bridge between the cylinders. The bridge locates the cylinders canted toward each other so that their top ends are closer together than their bottom ends. Suitably, the cylindrical axes intersect at an acute angle, for example of about 25°. The effect of this angular configuration is to provide r.f. penetration and sensitivity to regions just beyond the primary resonance region, specifically, the chest wall and lateral portions of tissue including specifically the axilla. The rectangular bands of conductive material extend around each of the cylinders to define single-turn solenoidal coils connected by the conductive material on the sides of the plates. A capacitor is defined by its conductive material and the dielectric plate. The coils and capacitor define a circuit that is in resonance at radio frequency. The resonant frequency may be tuned by a variable capacitor which extends through the bridging plate and varies the capacitance presented by the plate. Electromagnetic coupling to the resonant circuit may be accomplished capacitively by connecting a transmission line across the gap plate, or inductively by placing a loop of wire at the end of one of the open cylinders. Either configuration permits transmitting and receiving radio frequency energy.

The foregoing, and other objects, features and advantages of the invention, as well as presently preferred embodiments thereof, will become more apparent from a reading of the following description in connection with the accompanying drawings, in which:

FIG. 5 is a perspective view of a resonator in accordance with another embodiment of the invention which is especially adapted for foot imaging;

FIG. 6 is a perspective view of the resonator shown in FIG. 5 taken from the side thereof diametrically opposite to the side which is shown in FIG. 5;

FIG. 8 is a perspective view of a resonator in accordance with a further embodiment of the invention;

FIG. 9 is a perspective view of the resonator shown in FIG. 8 turned 90° in the clockwise direction from FIG. 8;

Figure 11:
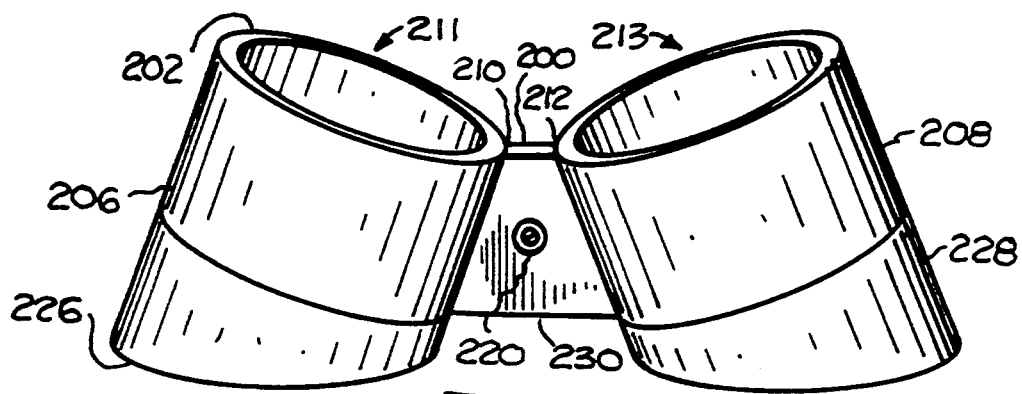
FIG. 11 is a perspective view of a resonator adapted for imaging of the breasts.
Figure 12:
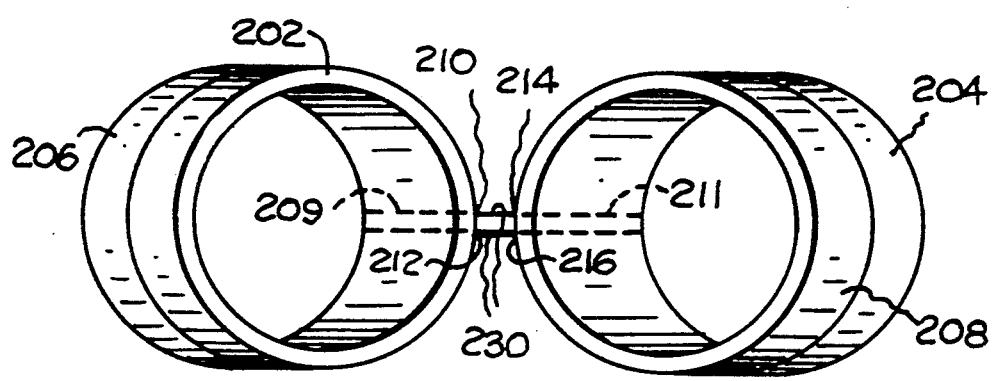
FIG. 12 is a perspective view of the resonator shown in FIG. 11 taken from the top.
Figure 15:
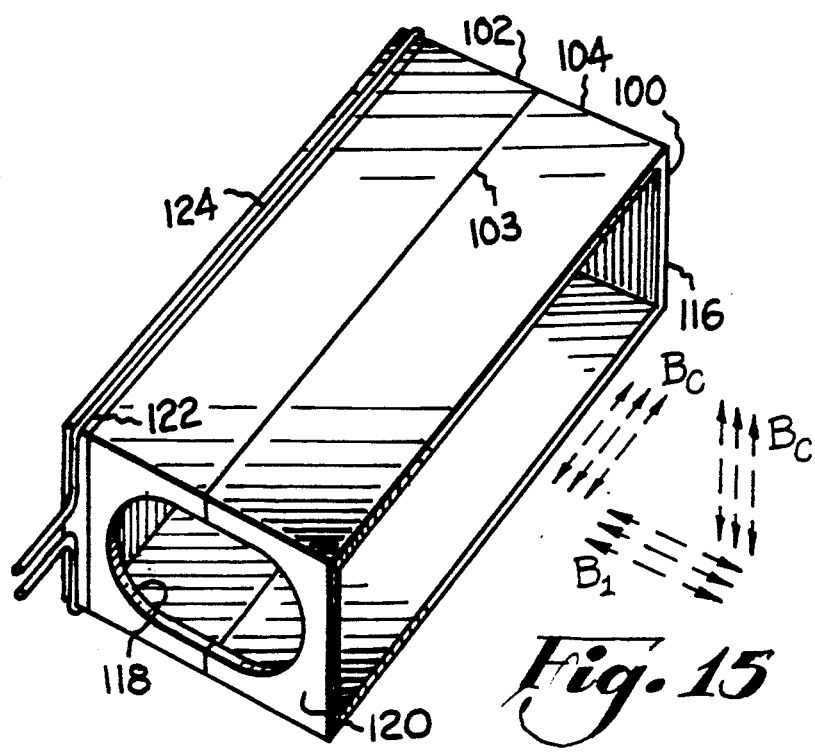
FIG. 15 is a perspective view of a resonator in accordance with the still further embodiment of the invention.

The resonators shown in FIGS. 2 to 10 and 15 to 17 are side-loading, single-turn solenoidal or loop-gap resonators which have openings in the side wall of a hollow cylinder (a tubular body) through which the body mass (the part of the anatomy) of interest for imaging may be inserted into the resonator. These resonators provide uniform RF magnetic fields by virtue of the tuning of their gaps using a series of capacitive and/or resistive elements which are positioned along the gap or gaps. The RF magnetic fields of these resonators are slightly perturbed because of their side openings, but are sufficiently uniform in the region of the solenoid where the part of the anatomy is placed to perform imaging without significant RF intensity decline as a function of the position of the body part in the resonator. The resonators may be used as both transmitter and receiver or as receivers alone. They may be located with their axes transverse to the $B_0$ field as shown in FIG. 15 where the $B_1$ field of the resonator is also shown. The resonator for imaging breasts which is shown in FIGS. 11 and 12 is also the subject of an article by J. P. Hornak, et al. which appeared in Radiology 1986; 161:832-834, December 1986 and J. P. Hornak et al., Magnetic Resonance Imaging 5, 233-237, 1987.

Figure 2:
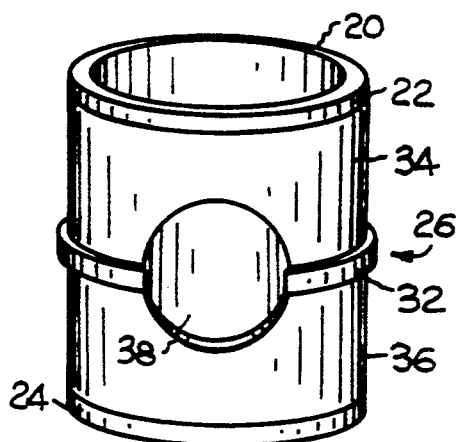
FIG. 2 is a perspective view from one side of a resonator in accordance with an embodiment of the invention.
Figure 3:
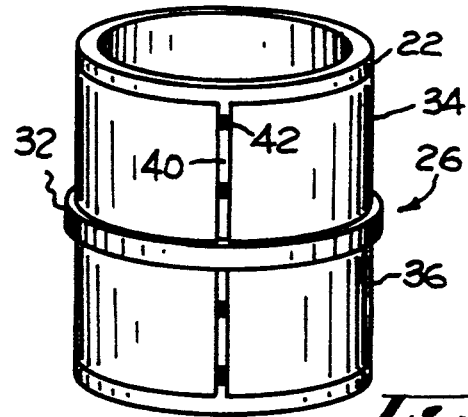
FIG. 3 is a perspective view of the resonator shown in FIG. 2 taken from the side thereof diametrically opposite from the side shown in FIG. 2.
Figure 4:
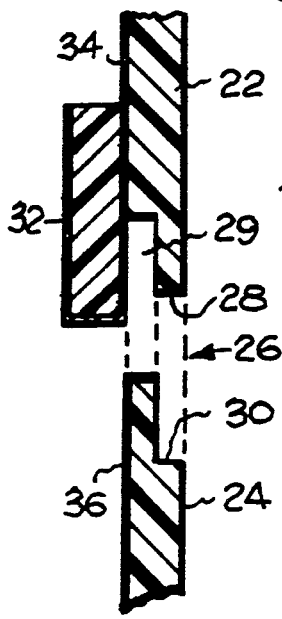
FIG. 4 is a fragmentary sectional exploded view, of the resonator shown in FIG. 2.

The resonator shown in FIGS. 2, 3 and 4 is especially adapted for imaging of the head. It is constructed of a cylindrical, tubular form 20 of dielectric material, suitably high molecular weight, rigid polyethylene, which is separated into upper and lower parts (an upper half 22 and a lower half 24) at a dividing surface and joint 26. While cylindrical and rectangular structures are illustrated and described as the preferred embodiments, any generally axially symmetric form may be used (e.g., elliptical, triangular, hexagonal, etc.). This joint 26 is defined by the surfaces 28 and 30 of the opposing ends of the upper and lower parts. These ends are stepped ends. A rim 32 is disposed around and connected to the upper part 22 and defines a notch 29 in the lower end of the part 22. The rim 32 is a support ring; a portion of the inside surface of which forms the notch 29. The stepped end surface 30 enters the notch when the upper and lower parts are assembled and forms a dovetail connection which is sturdy and reliable. The support ring 32 may be eliminated in executions using sturdy support materials for the main structure.

Bands 34 and 36 of conductive, suitably copper, foil are wrapped around and attached, as by cement to the outer peripheries of the upper and lower halves 22 and 24 of the resonator. In forming the dividing surface and joint 26, the conductive foil 34, which may be of copper, is wrapped around the rim 32. The foil 36 is also wrapped over the end surface 30. Therefore, when the upper and lower parts 22 and 24 are assembled together, a conductive connection (ohmic) of negligible resistance is provided between the foil bands 34 and 36 continuously around the joint, and they function as a single solenoidal coil.

An opening 38, which may be of convenient anatomical shape, circular, elliptical, etc. is provided in the resonator. The upper and lower semicircular sectors of the opening are disposed on opposite sides of the joint 26. A patient's head is placed in the resonator when the upper and lower halves are separated so that the opening extends around the neck. Then the halves are assembled thereby providing ready access to the resonator. The patient may move his or her head without disturbing the resonator.

Figure 1:
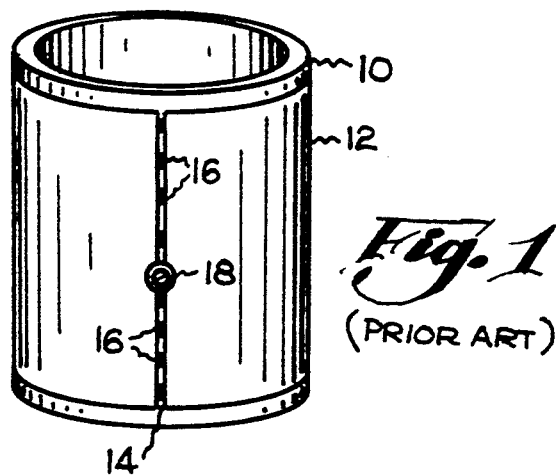
FIG. 1 is a perspective view of a single-turn solenoid loop-gap resonator which is discussed above.

The ends of the bands 34 and 36 are separated to form a gap 40 which runs parallel to the longitudinal axis of the cylindrical tube 20 which also is the axis of the solenoidal coil defined by the bands 34 and 36. Chip capacitors 42 are spaced from each other along the gap in the direction of the axis. Their spacing and value may be used to vary the resonant frequency (tuning) of the resonator and to provide a homogeneous field in the resonator. A variable capacitor may also be used as shown in FIG. 1. The chip capacitors may be accompanied by resistors to control the band width and Q of the solenoidal coil. A plurality of gaps may be used, so as to maintain RF uniformity and high Q when the body mass is within the resonator (i.e., to reduce effects of patient loading).

Figure 7:
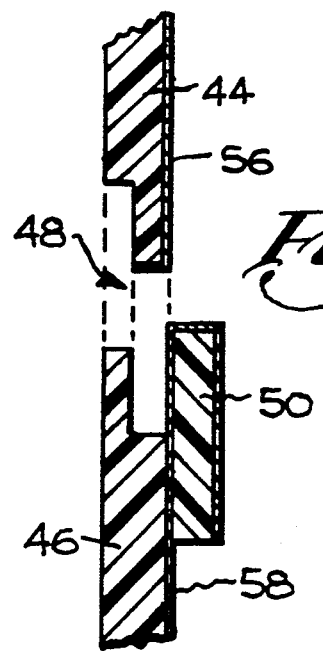
FIG. 7 is a fragmentary sectional exploded view of the resonator shown in FIG. 5 when the upper and lower parts of the resonator are separated; the view being similar to FIG. 4 which is also taken with the upper and lower parts of the resonator separated.

Referring to FIGS. 5, 6 and 7, there is shown a resonator which is especially adapted for imaging of the foot. It is constructed of a cylindrical tube 42 of dielectric material, such as polyethylene. The tube has upper and lower parts 44 and 46 which are separated by a seam 48. The seam provides a dividing surface and is within a rim 50 provided by a ring which is attached to the upper half 44 in the same manner as the rim 32 shown in FIGS. 2, 3 and 4. The seam is closer to the lower end of the resonator than to the upper end so as to allow sufficient room for the foot to be placed within the resonator with easy access through the transverse opening 52. The heel is then adjacent to the lower end of the resonator, while the toes of the foot can extend toward the upper end of the resonator.

Conductive foil bands 56 and 58 are wrapped around the upper and lower parts 44 and 46 of the resonator and also around the rim 50 as shown in FIG. 7. The structure of the seam 48 between the upper and lower parts 44 and 46 is similar to that shown in FIG. 4 except that the rim 50 is connected to the lower part 46. A gap 60 running along the axis of the cylindrical tube and solenoidal coils defined by the bands 56 and 58 is bridged by chip capacitors and/or resistors 62. One or more of these capacitors 64 may be a variable capacitor. The spacing and values of these capacitors are arranged to optimize the uniformity of the RF magnetic field with minimal distortions in the regions of anatomic interest.

The singly perforated resonators depicted in FIGS. 2 and 5 are also suitable for imaging of the shoulder. For shoulder imaging the resonator may be constructed around a single tubular form, thus eliminating the need for the seam 26 in FIG. 2 and 48 in FIG. 5. The resonator is positioned about the shoulder with the arm passing into the tubular opening and out through the perforation in the resonator.

Figures 10, 13:
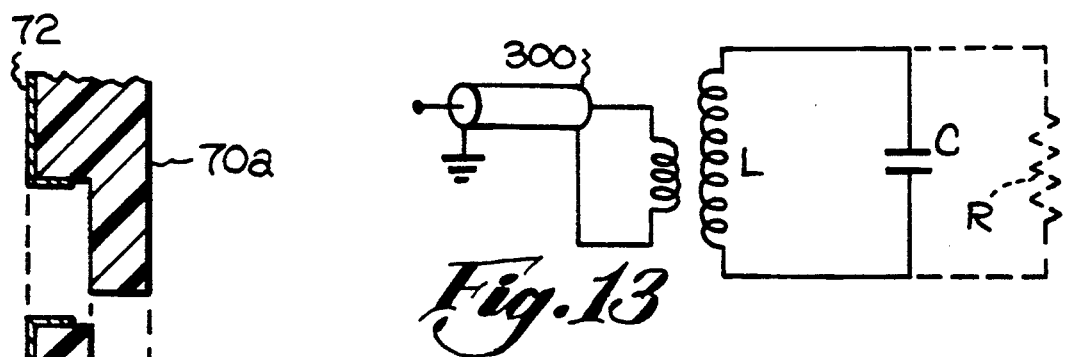
FIG. 10 is an exploded view similar to FIGS. 4 and 7 with the upper and lower parts of the resonator separated.
FIG. 13 is a schematic diagram of an inductive coupling circuit which may be used for coupling of RF electromagnetic energy with respect to the resonators shown in the preceding FIGURES.

Referring to FIGS. 8, 9 and 10, there is shown a resonator which is especially suitable for handling the knee. This may be constructed as a one- or two-part resonant device. In the case shown, a two-part tubular, cylindrical form of dielectric material 70 (e.g. polyethylene) is covered by bands 72 and 74 of conductive (e.g. copper) foil. These bands are separated by one or more gaps 76 which may be bridged by capacitors and/or resistors 78, one or more of which may be a variable capacitor 80. The advantage of the multiple gap configuration is that the device is less sensitive to frequency and impedance shifts caused by sample loading. The parts are separated by a seam or dividing surface 82 which is defined by step ends of the upper and lower halves 70A and 70B of the resonator. The bands 72 and 74 extend across the step ends and contact each other to form a butt joint when the parts 70A and 70B are assembled together.

Large openings 86 and 88 are disposed diametrically opposite to each other in the cylindrical wall of the resonator. These allow ready access of the knee which may be extended through the openings when the parts 70A and 70B are separated or the parts may then be brought together to complete an effectively single solenoid coil. A similar design resonator may be used for imaging of the elbow, wrist, calf or thigh since the arm can extend through the holes 86 and 88.

Figure 16:
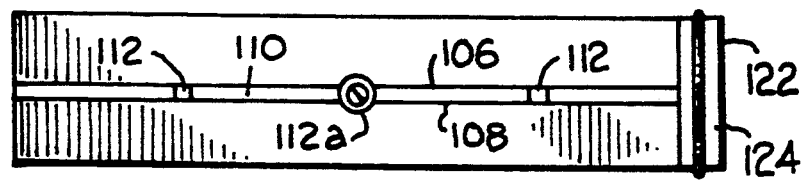
FIG. 16 is a rear end view of the resonator shown in FIG. 15.
Figure 17:
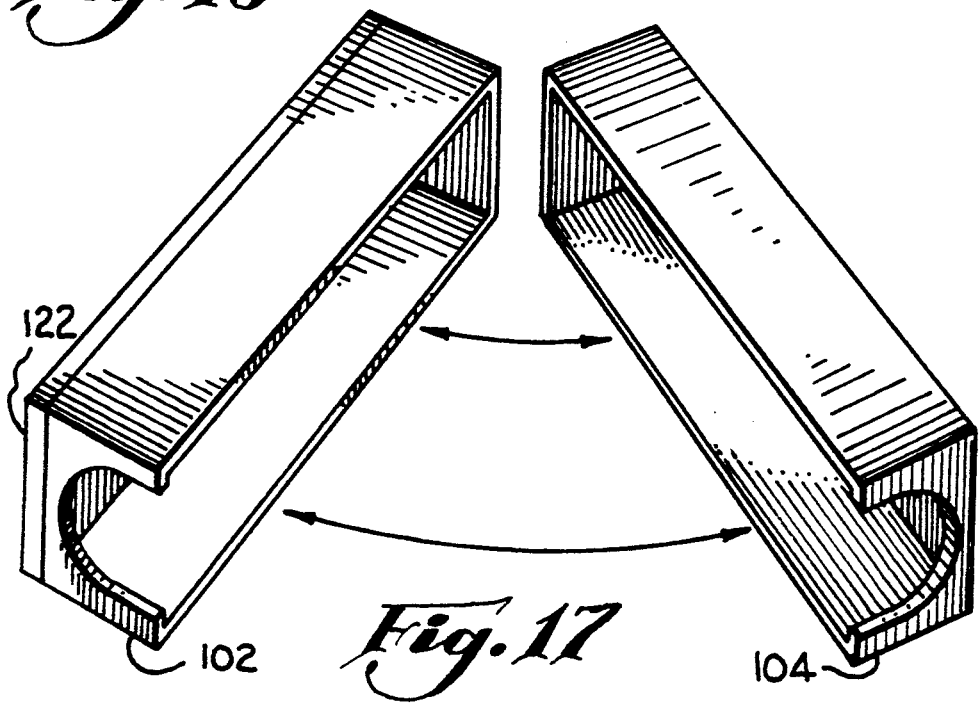
FIG. 17 is a perspective view illustrating the parts of the resonator shown in FIGS. 15 and 16 in separated position, the resonators shown in FIGS. 15, 16 and 17 being especially adapted for imaging of the hand and wrist.

Referring next to FIGS. 15, 16 and 17, there is shown a resonator for hand and wrist imaging which utilizes a rectangular tube 100 which is open at its opposite ends shown at the left and right sides of the tube 100 in FIG. 15. The tube may be a body of conductive material. In the interest of light weight, the tube 100 may be made of two-parts 102 and 104 as shown in the drawing. These parts may be provided by a rectangular tubular form of dielectric material (plastic) covered with bands of conductive material (foil). The ends of the bands, shown at 106 and 108 in FIG. 16 define a gap 110 which may be bridged by spaced capacitors and resistors 112. One or more of these components 112a may be a variable capacitor. In the event that the tube is made of conductive material a gap is still provided in the rear end 116 thereof and filled with a spacer of dielectric material, such as plastic.

An oblong opening 118, one-half of which is in the part 102 and the other in the part 104 is provided in the front side 120 of the rectangular tube. It is through this opening 118 that the hand and wrist is inserted when the parts 102 and 104 are separated as shown in FIG. 17.

A rectangular block 122 of dielectric material, such as a block of plastic (e.g. polyethylene) is attached to the open end at the left side of the tubular body 100 and provides a base on which a coupling coil 124 is disposed. The ends of the coil may be connected to a circuit for transmitting and/or receiving RF signals to the resonator. Joints at the seam 103 between the parts 102 and 104 may be provided. The joints may be of a design shown in FIGS. 4, 7 or 10 when conductive foil bands are used around a rectangular form. When a solid form is used, a sliding connection is preferably provided to obtain a low resistance Ohmic contact continuously along the seam 103. A ribbed support made of plastic may be fixed inside the resonance region of the device to provide for reproducible positioning of the hand within the device at several orientations. This adaptation is important for efficient diagnostic imaging.

Referring to FIGS. 11 and 12 there is shown a single-turn solenoid resonator pair with first and second solenoidal coils 211 and 212. These coils are placed adjacent to each other and connected by a capacitative element provided by a plate 200 of insulating material with conductors covering both sides such as a double-sided printed circuit board. The plate 200, therefore, is covered on each side thereof with a conductive layer. The resonator is constructed using two tubular (hollow) cylindrical forms 202 and 204 of dielectric material, such as polyethylene. Conductive cylinders or solenoids are provided by wrapping bands 206 and 208 of conductive foil around the cylinders. These bands extend to the opposite sides of the plate 200 at corners 210 and 212 in the case of the band 206 and 214 and 216 in case of the band 208. At these corners the bands connect to the conductive layers on the opposite sides of the printed circuit board plate 200. This plate may be pierced with a variable capacitor 220 so as to vary the capacitance of the capacitative element defined by the plate 200 and the conductive material on the opposite sides thereof.

The axes of the cylinders 202 and 204 and therefore the axes of the solenoidal single-turn coils are canted towards each other, because the plate 200 is trapezoidal in shape. These axes may be at an acute angle, suitably 25° and disposed in the same plane which also contains the diameter of the cylinders 202 and 204, which diameter passes through the center of plate 200. The upper ends of the cylinders lie in planes which are perpendicular to the axes of the cylinders. These upper ends form the top of the resonator. The lower ends of the resonator are in planes lying at an acute angle to the axes of the cylinders. In other words the walls of the cylinders which are along the edges of the plate 200 are shorter than in locations diametrically opposite to the plate 200. If the base ends 226 and 228 of the cylinders 202 and 204 were placed on a flat surface, the top surfaces of the cylinders would be at the 25° angle with respect to the flat surface.

The conductive solenoidal coils defined by the bands 206 and 208 each contain a slit 209 and 211, respectively, running the length of the bands along the opposite edges of the plate 200 where the bands are connected to the conductive layers on the opposite sides of the plate.

When the patient is lying in a prone configuration the resonator is placed over the patient's breast(s) pendant in the cylinders. Electromagnetic energy may be coupled to the cylinders by a transmission line, the ends of which are shown at 230. Alternatively, a coupling coil may be electromagnetically coupled to either of the solenoidal coils definited by the bands 206 or 208.

Referring to FIG. 13, it will be seen that the electrical circuit of the resonators consists of an inductor L, defined by the conductive foil bands thereof and a capacitor, C, defined by the gap(s). The capacitor is variabled to receive frequency tuning of the resonator. If desired in order to broaden the tuning, resistive elements placed across the gap may be used as schematically indicated at R. RF energy is coupled into and out of the resonant circuit defined by the coil and capacitor by means of a transformer T provided by another coil which may be movably positionable with respect to the resonator solenoidal coil for impedance matching purposes. The coupling coil is connected through a 50 ohm coaxial line 300 to supply or receive the RF sign.

Figure 14:
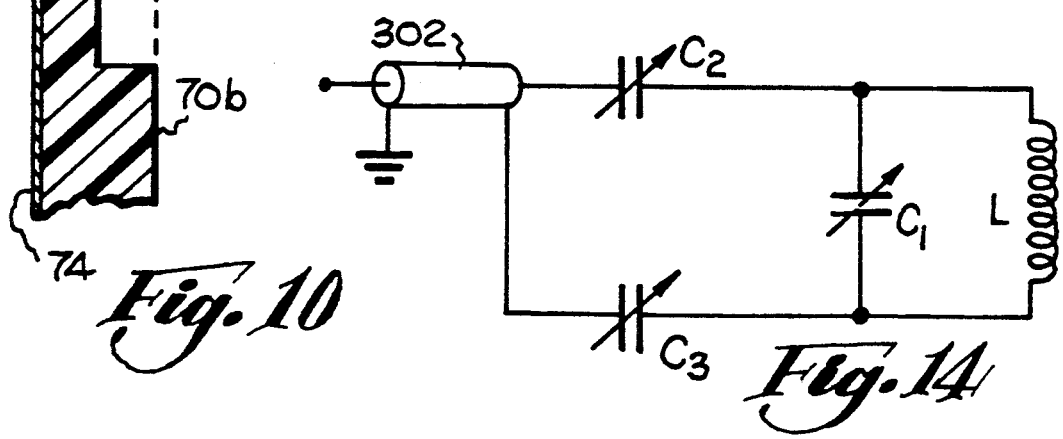
FIG. 14 is a schematic diagram of another circuit for coupling RF electromagnetic energy with respect to the resonators in the preceding FIGURES.

Referring to FIG. 14 there is shown the coil of the resonator L and the capacitor $C_1$ in parallel with that coil. A 50 ohm transmission line 302 is connected through balancing capacitors $C_2$ and $C_3$. Both transmitted signals and received signals may be connected as with the circuits shown in FIG. 2 of the above referenced article by J. P. Hornak et al. which appeared in the December 1986 issue of Radiology 1986.

From the foregoing description it will be apparent that there has been provided improved RF resonators for magnetic resonance imaging systems. While various embodiments of the invention have been described, variations and embodiments thereof within the scope of the invention, will undoubtedly suggest themselves to those skilled in the art. Accordingly the foregoing description should be taken as illustrative and not in a limiting sense.

We claim:

1. A resonator in which an RF field is established for magnetic resonance imaging of a portion of a tissue mass contained within said resonator when said resonator is disposed within a magnetic resonance imaging system which produces a magnetic field, said resonator comprising a conductive tubular assembly having axial symmetry and of sufficient internal volume to contain said tissue mass, said assembly having an axis, said assembly forming a single turn solenoidal coil around said axis, said assembly having at least one gap disposed transversely of said axis, said assembly forming a continuous conductive surface except for said at least one gap, at least one opening into said continuous surface of said assembly, said at least one opening being transverse to said axis and defining an entrance for said tissue mass within the confines of said coil, said assembly comprising two parts which are disposed colinearly along said axis, said assembly being divided along a surface on one side of which one of said parts is disposed and on the other side of which the other of said parts is disposed, said at least one opening being intersected by said dividing surface whereby to enable entry of said tissue mass through said at least one opening into said assembly when said parts are separated and to confine said tissue mass in said assembly when said parts are assembled, said parts being in conductive contact along said dividing surface when assembled, said gap forming a capacitance in series with said coil which resonates with the inductance presented by said coil.

2. The resonator according to claim 1 wherein said assembly parts are each cylindrical and have a common diameter.

3. The resonator according to claim 1 wherein said assembly parts each are rectilinear in cross-sections of the same shape and dimensions.

4. The resonator according to claim 1 wherein one of said parts has a rim which extends over the other of said parts and defines said dividing surface.

5. The resonator according to claim 1 wherein said dividing surface approximately bisects the length of said assembly and at least one opening.

6. The resonator according to claim 5 wherein said tissue mass is a substantially egg shaped mass of bone and tissue of a subject and said at least one opening is sufficiently large to pass a portion of the subject which connects said egg shaped mass to said subject so that said egg shaped mass is in said assembly.

7. The resonator according to claim 5 wherein said tissue body mass is a pair of parts of a subject which are connected by a joint, and a pair of said openings are provided diametrically opposite to each other in the wall of said assembly body, said openings being sufficiently large to pass the parts of said subject on opposite sides of said joint so that the joint and its surrounding regions are in said assembly body.

8. The resonator according to claim 1 wherein said assembly has opposite ends, said dividing surface closer to one of said opposite ends than to the other, said tissue mass is a first part and a second part of a subject which are connected by a joint such that said parts are normally disposed substantially at a right angle and said opening is of sufficient size to pass said joint of the subject so that one of said parts is disposed in said assembly.

9. The resonator according to claim 1 wherein said assembly is comprised of a foil of conductive material, and a form of dielectric material having an exterior surface, said foil being disposed upon said exterior surface, said form having two parts, each with opposite ends, the surfaces of one end of each of said form parts defining said dividing surface, said foil on each of said form parts extending to said dividing surface, said foil extending at least partially across said one end of at least one of said form parts into contact with the foil on the other of said form parts.

10. The resonator according to claim 9 wherein said one end of each ends, of said form parts are stepped and engage each other in overlapping relationship with the foil on each of said form parts in contact along said dividing surface.

11. The resonator according to claim 10 further comprising a rim having an outer and an inner surface attached to said stepped end of one of said form parts, said inner surface forming a notch along said stepped end, the foil on said one of said form parts extending along the inner surface of said rim to define a side of said notch so that said foils on each of said form parts are in contact along said side of said notch.

* * * * *